United States Patent
Raeth et al.

(10) Patent No.: US 12,495,516 B2
(45) Date of Patent: Dec. 9, 2025

(54) INTERLAYER HEAT SINK FOR COOLING SYSTEM OF AN ELECTRONIC CARD OF A SUPERCOMPUTER

(71) Applicants: BULL SAS, Les Clayes-sous-Bois (FR); Le Commissariat à l'énergie atomique et aux énergies alternatives (CEA), Paris (FR)

(72) Inventors: Marc Raeth, Tacoignières (FR); Luc Dallaserra, Paris (FR)

(73) Assignees: BULL SAS, Les Clayes-sous-Bois (FR); Le Commissariat à l'énergie atomique et aux énergies alternatives (CEA), Paris (FR)

( * ) Notice: Subject to any disclaimer, the term of this patent is extended or adjusted under 35 U.S.C. 154(b) by 210 days.

(21) Appl. No.: 18/366,612

(22) Filed: Aug. 7, 2023

(65) Prior Publication Data

US 2024/0074101 A1    Feb. 29, 2024

(30) Foreign Application Priority Data

Aug. 31, 2022   (EP) .................................. 22306294

(51) Int. Cl.
   *H05K 7/20*   (2006.01)
(52) U.S. Cl.
   CPC ..... *H05K 7/20263* (2013.01); *H05K 7/20254* (2013.01); *H05K 7/20281* (2013.01); *H05K 7/20509* (2013.01)
(58) Field of Classification Search
   CPC ........... H05K 7/20254; H05K 7/20263; H05K 7/20281; H05K 7/20509

USPC ........................................................ 165/80.4
See application file for complete search history.

(56) References Cited

U.S. PATENT DOCUMENTS

| 9,357,675 | B2 * | 5/2016 | Campbell ............... B23P 15/26 |
| 11,547,022 | B2 * | 1/2023 | Gao .................... H05K 7/20809 |
| 11,700,709 | B2 * | 7/2023 | Gao .................... H05K 7/20254 |
| | | | 361/699 |

(Continued)

FOREIGN PATENT DOCUMENTS

| EP | 2770810 B1 | 2/2014 |
| EP | 2770809 B1 | 4/2019 |

(Continued)

OTHER PUBLICATIONS

Search Report issued in EP22306294.4 on Feb. 13, 2023 (5 pages).

*Primary Examiner* — Joel M Attey
(74) *Attorney, Agent, or Firm* — ARC IP Law, PC; Joseph J. Mayo

(57) ABSTRACT

An interlayer heat sink for a liquid cooling system for an electronic card, the interlayer heat sink including a cold inlet connector, a hot inlet connector, a hot outlet connector, and a cold outlet connector. An upper part of the cooling block divides the flow of heat transfer fluid entering through the cold inlet connector into a first flow, which is oriented towards the lower part of the cooling block so as to collect heat generated by the electronic card by being conveyed to the hot outlet connector, and a second flow, oriented directly to the cold outlet connector, to convey the flow of heated-up heat transfer fluid received on the hot inlet connector directly to the hot outlet connector where it fuses with the heated-up flow in the lower part of the cooling block.

10 Claims, 5 Drawing Sheets

(56) References Cited

U.S. PATENT DOCUMENTS

| | | | |
|---|---|---|---|
| 12,057,368 B2* | 8/2024 | Gao | H01L 23/3672 |
| 12,341,082 B2* | 6/2025 | Gao | F28F 3/14 |
| 2016/0118317 A1 | 4/2016 | Shedd et al. | |
| 2016/0128238 A1* | 5/2016 | Shedd | F25B 41/42 |
| | | | 361/679.47 |
| 2018/0340744 A1 | 11/2018 | Tsai et al. | |
| 2023/0089909 A1* | 3/2023 | Gao | H05K 7/20781 |
| | | | 361/679.53 |
| 2024/0175611 A1* | 5/2024 | Shedd | H05K 7/20772 |

FOREIGN PATENT DOCUMENTS

| | | | |
|---|---|---|---|
| EP | 3500079 A1 | 6/2019 | |
| WO | 2019115963 A1 | 6/2019 | |

* cited by examiner

INTERLAYER HEAT SINK FOR COOLING SYSTEM OF AN ELECTRONIC CARD OF A SUPERCOMPUTER

This application claims priority to European Patent Application Number 22306294.4, filed 31 Aug. 2022, the specification of which is hereby incorporated herein by reference.

BACKGROUND OF THE INVENTION

Technical Field of the Invention

At least one embodiment of the invention relates to the field of cooling computer processors and more particularly relates to a liquid cooling system of an electronic card comprising at least one computing processor.

Description of the Related Art

Server computing blades generally contain electronic cards, including processors, which emit heat and therefore need to be cooled. Initially, these electronic cards were cooled by air. However, in the case of rack-mountable servers, the air circulation is not sufficient to cool electronic cards. To solve this problem, fluidic cooling systems have been developed.

Among the well-known electronic card cooling solutions, IBM® has developed a dual processor electronic card cooling system for supercomputers. Such a system comprises copper pipes containing a heat transfer fluid forming a liquid loop. However, the rigidity of copper pipes does not allow quick disassembly of a single processor. In addition, the liquid loop ensures cooling of the processors only. The rest of the dissipated power is cooled by convection in the air, which is not optimal for the Power Usage Effectiveness (PUE) of the supercomputer.

Other electronic card manufacturers provide liquid cooling systems dedicated solely to processors. These incorporate a heat sink, an integrated pump and a heat exchanger for extracting calories. Of course, such devices are not compatible with larger-scale systems such as supercomputers due to overall size reasons.

The applicant has further developed a mixed cooling system in which electronic cards are cooled by means of a cold plate of aluminum inside which a heat transfer liquid circulates, the cold plate being interfaced with all the low and medium electronic components to be cooled, that is all the components of an electronic card excluding the high electronic components (typically the processors and memory modules). Processors are the most restrictive components to cool (because they have to remain accessible) and also the most dissipating. They cannot be interfaced with the cold plate directly. In order to ensure thermal contact with the processors, each of them is interfaced with an intermediate heat sink with heat pipes. It is a phase change, two-phase heat sink (usually referred to as "Heat Spreader CPU"), which conducts heat from the processors to the cold plate. The part of the heat pipes in contact with the copper slab that interfaces the processor constitutes the evaporator, while that in contact with the interface with the cold plate constitutes the condenser. This solution is described in more detail in European patent applications EP 2770809 and EP 2770810 belonging to the applicant.

This processor cooling solution using heat pipes also has drawbacks, and in particular:
thermal limits specific to heat pipes: the flow inside a heat pipe is two-phase and is governed by five limits in terms of flow, viscosity, boiling, driving, capillarity, which depend on the dimensions of the heat pipes and the power to discharge.
mechanical limits: the increase in the number of heat pipes results in an increase in the rigidity of the assembly. However, in order to compensate for tolerances, it is essential that the heat sink deforms sufficiently.
a high number of removable thermal interfaces: thermal contacts should be ensured between the cold plate and the heat sink on the one hand, and between the heat sink and the processor on the other hand. In the current solution implemented by the applicant, these thermal contacts are guaranteed by the use of conductive grease, which has the drawback of generating a high temperature gradient.
the complexity and cost of the overall solution: the solid/fluid exchange surfaces are currently at the cold plate. The complexity of this in terms of heat sinks considerably increases machining in the cold plate and hence the manufacturing cost.

To solve the aforementioned defects and drawbacks, the applicant developed a cooling system for an electronic card that is fully liquid, comprising a cold plate supplied with heat transfer fluid via a water path internal to the cold plate, and a plurality of heat sinks connected as flexible connections with the water path internal to the cold plate. These flexible connections form a flexible network coupled to the network of rigid channels of the cold plate supplied with heat transfer fluid (typically glycol water), thus allowing the heat sinks to be supplied with heat transfer fluid. This network is coupled with the cold plate system allowing cooling of the rest of the electronic card. In order to optimize the cooling of the processor as much as possible, the heat transfer fluid must be brought as close as possible to the heat source. To this end, the applicant specifically developed a single-phase heat sink comprising a cooling block of heat-conducting material that can be supplied with heat transfer fluid. The heat source constituted by the processor will therefore be directly interfaced with this cooling block (also referred to in the examples by the term "waterblock") supplied with heat transfer fluid taken from the cold plate. Such an integrated cooling system meets restrictions of thermal efficiency, mechanical compactness and maintainability necessary for this type of high-performance computing equipment. This solution is described in detail in document WO2019115963.

In a known manner, multi-processor calculators require as many cooling blocks as processors.

For a given chain of components, in a known solution illustrated in FIG. 1, the heat exchangers 100 are connected in series, that is the inlet of the first exchanger 100 is connected to a liquid inlet via an inlet hose 101, its outlet is connected to the inlet of the next exchanger 100 via a connecting hose 102 and so on up to the outlet of the last exchanger 100 which is connected to a liquid outlet via an outlet hose 103. As the exchangers are in series, the temperature of the liquid increases as it approaches the liquid outlet (the liquid is warmer when it arrives in the last exchanger as it has already been used to cool the previous exchangers) and therefore the components located at the end of the chain are less well cooled than those at the beginning of the chain. In addition, this solution makes component maintenance complicated, as all exchangers in flexible connection must be removed to change a component in the chain, particularly beyond two exchangers in series.

In order to at least partially overcome these drawbacks, it is known to fit the exchangers 100 in parallel and no longer in series, as illustrated in FIG. 2. Thus, each processor is cooled independently of the others and each cooling block can be easily changed in the event of a problem. However, this solution has the drawback of requiring as many connectors (not represented for the sake of clarity) and inlet hoses 104 as there are processors and as many connectors (not represented for the sake of clarity) and outlet hoses 105 as there are processors. However, the connectors and inlet hoses 104 and the connectors and outlet hoses 105 require a significant amount of space to be connected to the cold plate. However, in multi-processor calculators, the lack of space can prove to be an obstacle to installing such a solution.

It would therefore be advantageous to provide a simple, reliable and effective solution to at least partially remedy these drawbacks.

BRIEF SUMMARY OF THE INVENTION

One purpose of at least one embodiment of the invention is therefore to provide a solution for cooling an electronic card, in particular a supercomputer. For this purpose, at least one embodiment of the invention defines several types of complementary heat sinks each having a specific function as well as a cooling system comprising such sinks.

Thus, one or more embodiments of the invention relates firstly to an inlet heat sink for a liquid cooling system for an electronic card, the card comprising at least one electronic component, for example a processor, a voltage regulator or a memory module, for example mounted to a support, the system including a cold plate for receiving the heat sink, the cold plate being dimensioned to cover at least partly the electronic card, in particular the support of the at least one electronic component, where applicable, and comprising a cooling circuit comprising channels inside which a so-called "cold" heat transfer fluid for supplying at least the heat sink circulates, and a discharge circuit comprising channels inside which a so-called "hot" heat transfer fluid that has heated up through the heat sink circulates, the heat sink comprising a cooling block made of heat-conducting material comprising a lower part constituting the main heat exchange zone and an upper part to be connected to the cold plate, the heat sink including:
 a so-called "cold" inlet connector fluidly connected to the upper part of the cooling block and which is to receive an inlet tube of the cooling circuit so that the cooling block is supplied with the heat transfer fluid from the cold plate,
 a so-called "hot" outlet connector,
 a so-called "cold" outlet connector,
 the upper part of the cooling block being configured to divide the heat transfer fluid flow entering through the cold inlet connector into a first flow, which is oriented towards the lower part of the cooling block so as to collect heat generated by the electronic card by being conveyed to the hot outlet connector, and a second flow, oriented directly towards the cold outlet connector.

The inlet heat sink according to one or more embodiments of the invention thus makes it possible to keep part of the cold flow coming from the cold plate to direct it to another heat sink connected to its outlet, thus improving cooling of the electronic component(s) (processor or other) located downstream in the direction of circulation of the heat transfer fluid. The inlet heat sink according to at least one embodiment of the invention also makes it possible to meet large-scale manufacturing restrictions, due to its simplicity of manufacture.

At least one embodiment of the invention also relates to an outlet heat sink for a liquid cooling system for an electronic card, the card comprising at least one electronic component, for example a processor, a voltage regulator or a memory module, for example mounted to a support, the system comprising a cold plate for receiving the heat sink, the cold plate being dimensioned to cover at least partly the electronic card, in particular the support for the at least one electronic component, where applicable, and comprising a cooling circuit comprising channels inside which a so-called "cold" heat transfer fluid circulates, for supplying the heat sink, and a discharge circuit comprising channels inside which a so-called "hot" heat transfer fluid circulates, having heated up through the heat sink, the heat sink comprising a cooling block made of heat-conducting material comprising a lower part constituting the main heat exchange zone and an upper part to be connected to the cold plate, the heat sink including:
 a so-called "cold" inlet connector fluidly connected to the upper part of the cooling block and which is to receive a connecting tube of the cooling circuit so that the cooling block is supplied with the heat transfer fluid from the cold plate (through at least one heat sink),
 a so-called "hot" inlet connector fluidly connected to the upper part of the cooling block and which is to receive a connecting tube of a flow of heated-up heat transfer fluid,
 a so-called "hot" outlet connector,
 the upper part of the cooling block being configured to, on the one hand, convey the flow of heat transfer fluid entering through the cold inlet connector to the lower part of the cooling block so as to collect heat generated by the electronic card by being conveyed to the outlet connector, and, on the other hand, convey the flow of heated-up heat transfer fluid received on the hot inlet connector directly to the outlet connector where it fuses with the heated-up flow in the lower part of the cooling block.

The outlet heat sink according to at least one embodiment of the invention thus makes it possible both to receive a flow of cold heat transfer fluid and to fuse hot flows coming from both the lower part of the cooling block and an upstream heat sink connected to the hot inlet of the outlet heat sink, thus improving cooling of the electronic component(s) associated with the outlet heat sink while allowing circulation of the heat transfer fluid. The outlet heat sink according to one or more embodiments of the invention also makes it possible to meet large-scale manufacturing restrictions, due to its simplicity of manufacture.

Advantageously, an inlet heat sink may be connected in pairs with an outlet heat sink to form an assembly of heat sinks according to at least one embodiment of the invention.

At least one embodiment of the invention also relates to an interlayer heat sink for a liquid cooling system for an electronic card, the card including at least one electronic component, for example a processor, a voltage regulator or a memory module, for example mounted to a support, the system comprising a cold plate for receiving the heat sink, the cold plate being dimensioned to cover at least partly the electronic card, in particular the support for the at least one electronic component, where applicable, and comprising a cooling circuit comprising channels inside which a so-called "cold" heat transfer fluid for supplying at least the heat sink circulates, and a discharge circuit comprising channels inside which a so-called "hot" heat transfer fluid circulates, which has heated up through the heat sink, the heat sink comprising a cooling block made of heat-conducting material comprising a lower part constituting the main heat exchange zone and an upper part to be connected to the cold plate, the heat sink including:

- a so-called "cold" inlet connector to be fluidly connected to a cold outlet connector of an upstream heat sink, in particular an inlet heat sink as set forth previously or another interlayer heat sink, and fluidly connected to the upper part of the cooling block so that the cooling block is supplied with the cold heat transfer fluid,
- a so-called "hot" inlet connector to be fluidly connected to a hot outlet connector of an upstream heat sink, in particular an inlet heat sink as set forth previously or another interlayer heat sink, and fluidly connected to the upper part of the cooling block,
- a so-called "hot" outlet connector to be fluidly connected to a hot inlet connector of a downstream heat sink, in particular an outlet heat sink as set forth previously or another interlayer heat sink,
- a so-called "cold" outlet connector to be fluidly connected to a cold inlet connector of a downstream heat sink, in particular an outlet heat sink as set forth previously or another interlayer heat sink,
- the upper part of the cooling block being configured to:
  divide the flow of heat transfer fluid entering through the cold inlet connector into a first flow, which is oriented towards the lower part of the cooling block so as to collect heat generated by the electronic card by being conveyed to the hot outlet connector, and a second flow, oriented directly towards the cold outlet connector,
  convey the flow of heated-up heat transfer fluid received on the hot inlet connector directly to the hot outlet connector where it fuses with the heated-up flow in the lower part of the cooling block.

Thus, in at least one embodiment, one or more interlayer heat sinks can be connected between an inlet heat sink and an outlet heat sink of a same assembly of heat sinks in order to cool more electronic components on a same line while allowing conveying of a cold heat transfer fluid flow to the downstream heat sinks of the assembly.

At least one embodiment of the invention also relates to a liquid cooling system for an electronic card, the card including at least one electronic component, for example a processor, a voltage regulator or a memory module, for example mounted to a support, the system including a cold plate and at least one assembly of heat sinks, the cold plate being for receiving the assembly of heat sinks, being dimensioned to cover at least partly the electronic card, in particular the support of the at least one electronic component, where applicable, and comprising a cooling circuit comprising channels inside which a so-called "cold" heat transfer fluid for supplying at least one of the heat sinks circulates, and a discharge circuit comprising channels in which a so-called "hot" heat transfer fluid has heated up through at least one of the heat sinks, each heat sink comprising a main heat exchange zone capable of bearing against one of the processors, each assembly of heat sinks comprising an inlet heat sink as set forth above and an outlet heat sink as set forth above, the inlet connector of the inlet heat sink being fluidly connected to the cooling circuit through an inlet tube, the cold outlet connector of the inlet heat sink being fluidly connected to the cold inlet connector of the outlet heat sink, the hot outlet connector of the inlet heat sink being fluidly connected to the hot inlet connector of the outlet heat sink, the outlet connector of the outlet heat sink being connected to the discharge circuit through an outlet tube.

The system according to one or more embodiments of the invention thus makes it possible to effectively cool the electronic card by distributing the cold heat transfer fluid between the inlet heat sink and the outlet heat sink of a same assembly of heat sinks. The cooling system according to at least one embodiment of the invention makes it possible to guarantee cooling of the electronic card components, by liquid means regardless of the nature of the electronic components: the low and medium components by the cold plate and the so-called high components such as processors and memory modules by the heat sinks, in particular single-phase, with cooling block. The cooling system according to at least one embodiment of the invention, due to its structure with cooling blocks connected as flexible connections with the cooling circuit of the cold plate allows great flexibility for disassembling the processors and guarantees reliable connections after a large number of disassembly operation cycles. A 10 bar tightness is guaranteed by the cooling system according to one or more embodiments of the invention, including after several disassembly operations. The cooling system according to at least one embodiment of the invention, due to its structure with cooling blocks connected as flexible connections with the cooling circuit of the cold plate, allows implantation of a plurality of heat sinks in series or in parallel, for example six in number.

Advantageously, in at least one embodiment, the hot outlet connector of the inlet heat sink is connected to the hot inlet connector of the outlet heat sink through a first flexible and/or rectilinear connecting tube and the cold outlet connector of the inlet heat sink is connected to the cold inlet connector of the outlet heat sink through a second flexible and/or rectilinear connecting tube.

In one or more embodiments, when the first connecting tube and the second connecting tube are rectilinear, they are arranged parallel to each other in order to optimize space and thereby reduce volume of the system.

In at least one embodiment, the at least one assembly of heat sinks comprises an interlayer heat sink as set forth above, fluidly connected on the one hand to the hot outlet connector and the cold outlet connector of the inlet heat sink and on the other hand to the hot inlet connector and the cold inlet connector of the outlet heat sink.

According to one or more embodiments of the invention, the system may comprise a plurality of assemblies of heat sinks, preferably arranged parallel to each other in order to optimize space and thus reduce volume of the system.

Advantageously, in at least one embodiment, the inlet tube of each inlet heat sink is flexible in order to facilitate assembly by flexible connections with the cold plate.

Advantageously, in at least one embodiment, the outlet tube of each outlet heat sink is flexible in order to facilitate assembly by flexible connections with the cold plate.

Further advantageously, in at least one embodiment, the at least one interlayer heat sink is connected to the inlet heat sink and/or the outlet heat sink via flexible and/or rectilinear connecting tubes.

At least one embodiment of the invention also relates to a method for separating a flow of "cold" heat transfer fluid in an inlet heat sink as set forth above for a liquid cooling system of an electronic card, the card comprising at least one electronic component, for example a processor, a voltage regulator or a memory module, for example mounted to a support, the system including a cold plate for receiving the heat sink, the cold plate being dimensioned to cover at least partly the electronic card, in particular the support of the at least one electronic component, where applicable, and comprising a cooling circuit comprising channels inside which a so-called "cold" heat transfer fluid for supplying at least the heat sink circulates, and a discharge circuit comprising channels inside which a so-called "hot" heat transfer fluid has heated up through the heat sink, the method comprising the steps of supplying the cold inlet connector with the heat transfer fluid from the cold plate and dividing the heat transfer fluid flow entering through the cold inlet connector into a first flow, which is oriented towards the lower part of the cooling block so as to collect heat generated by the electronic card by being conveyed to the hot outlet connector, and a second flow, oriented directly to the cold outlet connector.

At least one embodiment of the invention also relates to a method for fusing a flow of heat transfer fluid in an outlet heat sink as set forth above for a liquid cooling system for an electronic card, the card including at least one electronic component, for example a processor, a voltage regulator or a memory module, for example mounted to a support, the system including a cold plate for receiving the heat sink, the cold plate being dimensioned to cover at least partly the electronic card, in particular the support of the at least one electronic component, where applicable, and comprising a cooling circuit comprising channels inside which a so-called "cold" heat transfer fluid for supplying the heat sink circulates, and a discharge circuit comprising channels in which a so-called "hot" heat transfer fluid has heated up through the heat sink, the method comprising the steps of supplying the cold inlet connector with the cold heat transfer fluid, supplying the hot inlet connector with a flow of heated-up heat transfer fluid, conveying the heat transfer fluid entering through the cold inlet connector to the lower part of the cooling block so as to collect heat generated by the electronic card by being conveyed to the outlet connector and conveying of the flow of heated-up heat transfer fluid received on the hot inlet connector directly to the outlet connector where it fuses with the heated flow in the lower part of the cooling block.

At least one embodiment of the invention also relates to a method for managing a flow of heat transfer fluid in an interlayer heat sink as set forth above for a liquid cooling system for an electronic card, the electronic card comprising at least one electronic component, for example a processor, a voltage regulator or a memory module, for example mounted to a support, the system comprising a cold plate for receiving the interlayer heat sink, the cold plate being dimensioned to cover at least partly the electronic card especially the support of the at least one electronic component, where applicable, and comprising a cooling circuit comprising channels inside which a so-called "cold" heat transfer fluid for supplying at least the heat sink circulates, and a discharge circuit comprising channels inside which a so-called "hot" heat transfer fluid has heated up through the heat sink, the method comprising the steps of:
 supplying the cold inlet connector with the heat transfer fluid from the cold plate,
 dividing the heat transfer fluid flow entering through the cold inlet connector into a first flow, which is oriented towards the lower part of the cooling block so as to collect heat generated by the electronic card by being conveyed to the hot outlet connector, and a second flow, oriented directly to the cold outlet connector,
 supplying the hot inlet connector with a flow of heated-up heat transfer fluid,
 conveying of the heated-up heat transfer fluid flow received on the hot inlet connector directly to the hot outlet connector where it fuses with the heated-up flow in the lower part of the cooling block.

The heat sink of the cooling system according to one or more embodiments of the invention must furthermore itself respect a space restriction defined by the size of the components (processors or others) and by the space available on the cold plates to judiciously distribute the cooling fluid.

BRIEF DESCRIPTION OF THE DRAWINGS

Further characteristics and advantages of the invention will further appear upon reading the description that follows. This is purely illustrative and should be read in conjunction with the appended drawings in which.

DETAILED DESCRIPTION OF THE INVENTION

Figure 1:
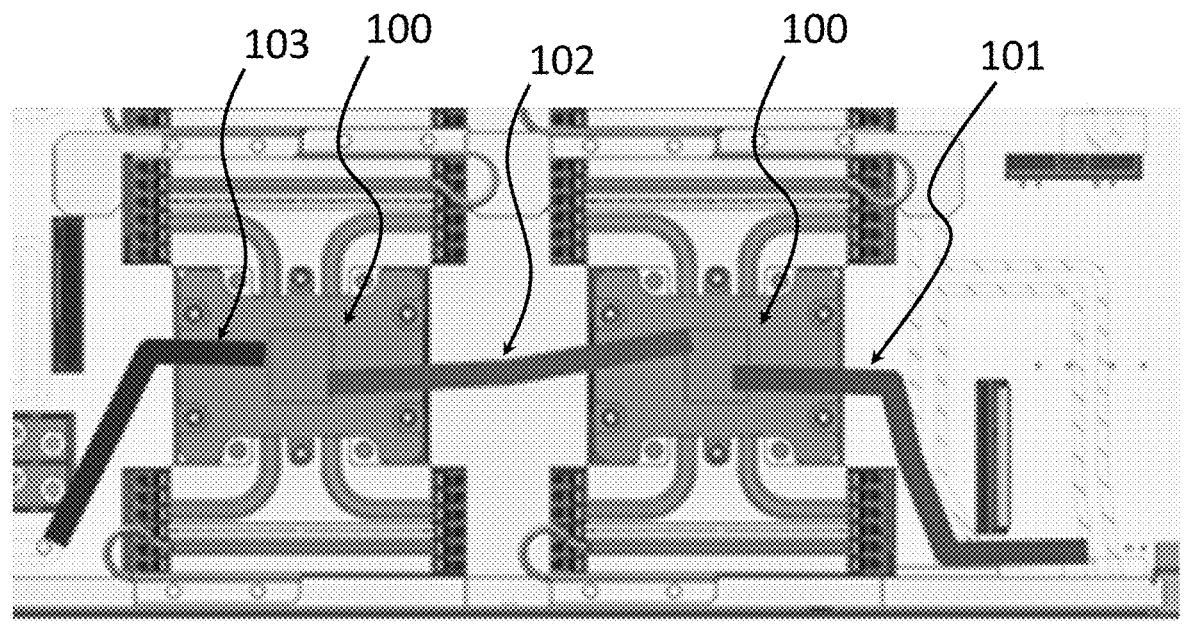
FIG. 1 schematically illustrates one embodiment of a system of prior art in which the heat sinks are mounted in series.
Figure 2:
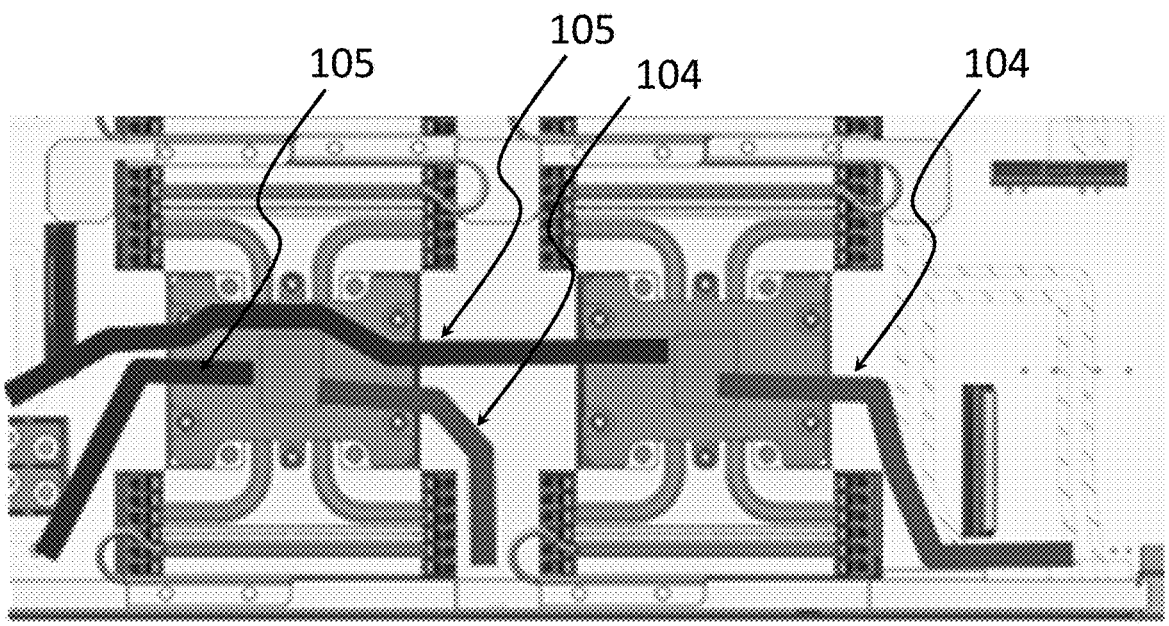
FIG. 2 schematically illustrates one embodiment of a system of prior art in which the heat sinks are mounted in parallel.
Figure 3:
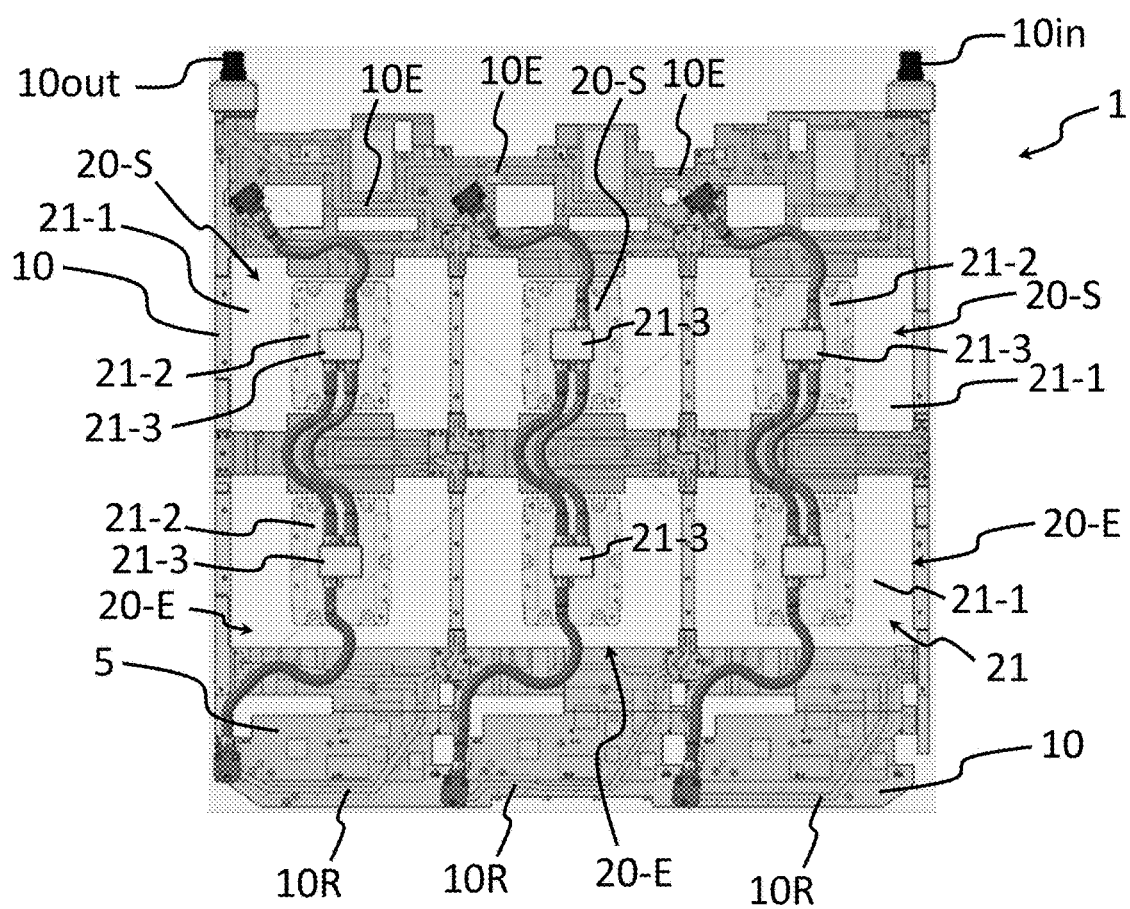
FIG. 3 schematically illustrates a system according to one or more embodiments of the invention.

FIG. 3 illustrates one example of system 1 according to one or more embodiments of the invention.

Figure 4:
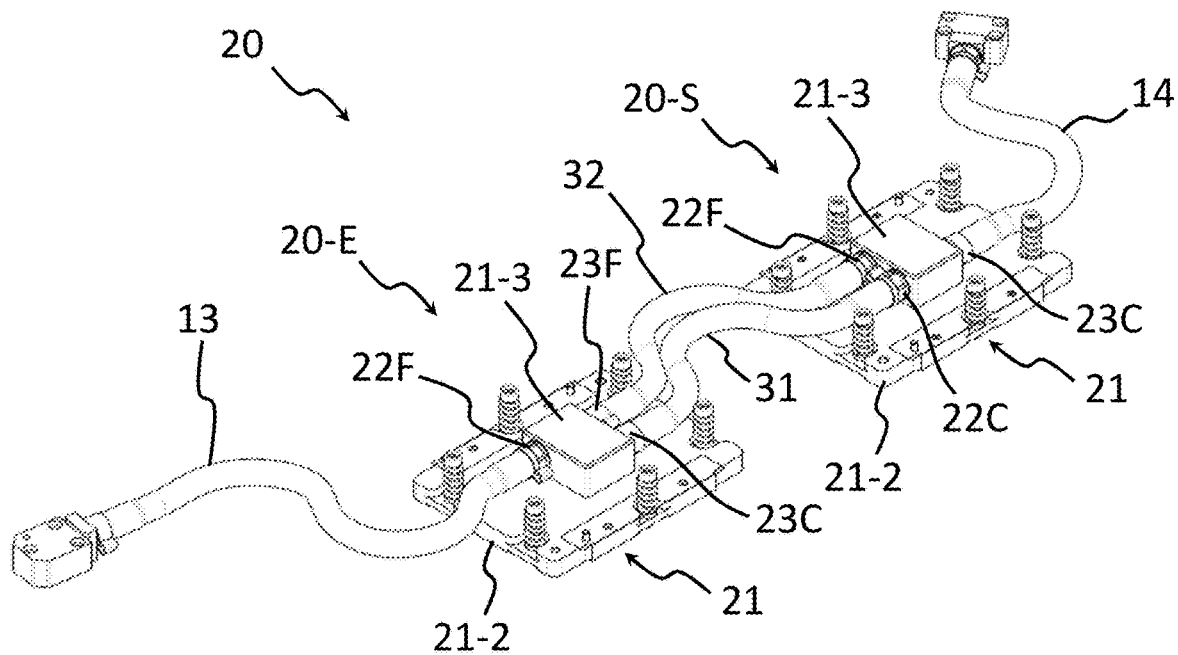
FIG. 4 schematically illustrates, partially, an assembly of heat sinks of the system of FIG. 3, according to one or more embodiments of the invention.

The system 1, in at least one embodiment, allows liquid cooling of an electronic card 5 (partially visible in transparency) and for this purpose comprises a cold plate 10 and assemblies 20 of heat sinks 20-E, 20-S, one of which is represented separately (and partially) in FIG. 4 by way of one or more embodiments.

In this example, in one or more embodiments, the electronic card 5 comprises six processors mounted to a support (not visible) of the electronic card 5. The electronic card 5 comprises a plurality of electronic components attached to the support, broken down for example into low and medium electronic components and high electronic components comprising the processors.

For the purposes of one or more embodiments of the invention, by "low and medium electronic components", it is meant any component of the electronic card 5 having a height below a threshold height, below which it can be cooled by the cooling circuit of the cold plate 10. For low and medium electronic components, these are usually power supplies or voltage regulators.

For the purposes of one or more embodiments of the invention, by "high electronic components", it is meant any component of the electronic card 5 which is not cooled by the cooling circuit of the cold plate 10 because they have to remain accessible without disassembling the cold plate 10. These are electronic components that require fast maintenance such as processors or memory modules.

In the example in FIG. 3, by way of at least one embodiment, the system 1 comprises, in addition to the cold plate 10, three assemblies 20 of heat sinks 20-E, 20-S arranged parallel to each other and each comprising an inlet heat sink 20-E and an outlet heat sink 20-S.

The cold plate 10 is dimensioned to cover the support of the processors. In this example, by way of at least one embodiment, the cold plate 10 has external dimensions substantially equal to those of the support of the electronic card 5 so that it covers the entire support and the low and medium electronic components.

The cold plate 10 comprises a cooling circuit 10R and a discharge circuit 10E. The cooling circuit 10R comprises channels, preferably rigid, inside which a so-called "cold" heat transfer fluid circulates for supplying the inlet heat sinks. The discharge circuit 10E comprises channels inside which a so-called "hot" heat transfer fluid circulates, which has heated up through the heat sinks 20-E, 20-S.

The supply with cold heat transfer fluid to the cold plate 10 is carried out via an inlet connector 10in and the outlet of the heated heat transfer fluid from the cold plate 10 is carried out via an outlet connector 10out.

The heat sinks 20-E, 20-S can be of the single-phase type.

Each heat sink 20-E, 20-S comprises a main heat exchange zone able to bear against a high electronic component, especially one of the processors, or a low electronic component, especially the voltage regulators and/or memory modules.

Referring to FIG. 4, by way of one or more embodiments, each heat sink 20-E, 20-S comprises a cooling block 21, at least one inlet connector 22C, 22F, and at least one outlet connector 23C, 23F (depending on the type of heat sink 20-E, 20-S).

The cooling block 21 is made of a heat-conducting material such as, for example, aluminum or aluminum alloy.

The cooling block 21 comprises a lower part 21-1 constituting the main heat exchange zone, a so-called "distribution" (optional) intermediate part 21-2 and an upper part 21-3 connected to the cold plate 10.

In at least one embodiment, the cooling block 21 comprises a through slot located in the intermediate part for homogeneously distributing the flow of the heat transfer fluid from the upper part in the form of a jet centered towards a support plate located in the main heat exchange zone and comprising a hollow central part with a zone provided with fins or pins to generate turbulence in the flow regime of the heat transfer fluid and a zone peripheral to the zone provided with fins or pins to collect heat transfer fluid and direct it towards the outlet connector. In at least one embodiment, the slot is thin. Thus, by way of one or more embodiments, in this configuration, the heat transfer fluid, when it arrives in the cooling block 21, passes through the thin slot, which allows it to be equally distributed in the exchange surface through the fins. The shape of this distributor and its distance from the fins are designed to obtain the largest possible Reynolds number in the available overall space.

Inlet Heat Sink 20-E

Still with reference to FIGS. 3 and 4, by way of one or more embodiments, each inlet heat sink 20-E comprises a so-called "cold" inlet connector 22F, a so-called "hot" outlet connector 23C and a so-called "cold" outlet connector 23F.

The cold inlet connector 22F is fluidly connected to the upper part of the cooling block 21 and receives an inlet, preferably flexible, tube 13 connected to the cooling circuit 10R to supply the cooling block 21 with the heat transfer fluid from the cold plate 10.

The upper part of the cooling block 21 is configured to divide the heat transfer fluid flow entering through the cold inlet connector 22F into a first flow and a second flow. In at least one embodiment, this division is carried out by implementing a Tickelman loop, known per se, at the cooling block 21.

The first flow is directed towards the lower part of the cooling block 21 so as to collect heat generated by the electronic card 5 by being conveyed to the hot outlet connector 23C.

The second flow is directed directly to the cold outlet connector 23F.

Outlet Heat Sink 20-S

Each outlet heat sink 20-S comprises a so-called "hot" inlet connector 22C, a so-called "cold" inlet connector 22F and a so-called "hot" outlet connector 23C.

The hot inlet connector 22C is fluidly connected to the upper part of the cooling block 21 and receives a first, preferably flexible, connecting tube 31 of a heat transfer fluid flow heated up by the inlet heat sink 20-E, connected to the hot outlet connector 23C of the inlet heat sink 20-E.

The cold inlet connector 22F is fluidly connected to the upper part of the cooling block 21 and receives a second, preferably flexible, connecting tube 32, connected to the cold outlet connector of the inlet heat sink 20-E, so that the cooling block 21 is supplied with the heat transfer fluid from the cold plate 10 through the inlet heat sink 20-E, especially from the cold outlet connector 23F of the inlet heat sink 20-E.

The upper part of the cooling block 21 is configured, on the one hand, to convey the flow of heat transfer fluid entering through the cold inlet connector 22F to the lower part of the cooling block 21 so as to collect heat generated by the electronic card 5 by being conveyed to the hot outlet connector 23C, and, on the other hand, to convey the heated-up flow of heat transfer fluid received on the hot inlet connector 22C directly to the hot outlet connector 23C. In at least one embodiment, this fusion is achieved by implementing a Tickelman loop, known per se, at the cooling block 21.

The hot outlet connector 23C of the outlet heat sink 20-S is connected to the discharge circuit of the cold plate through an outlet tube 14.

Figure 5:
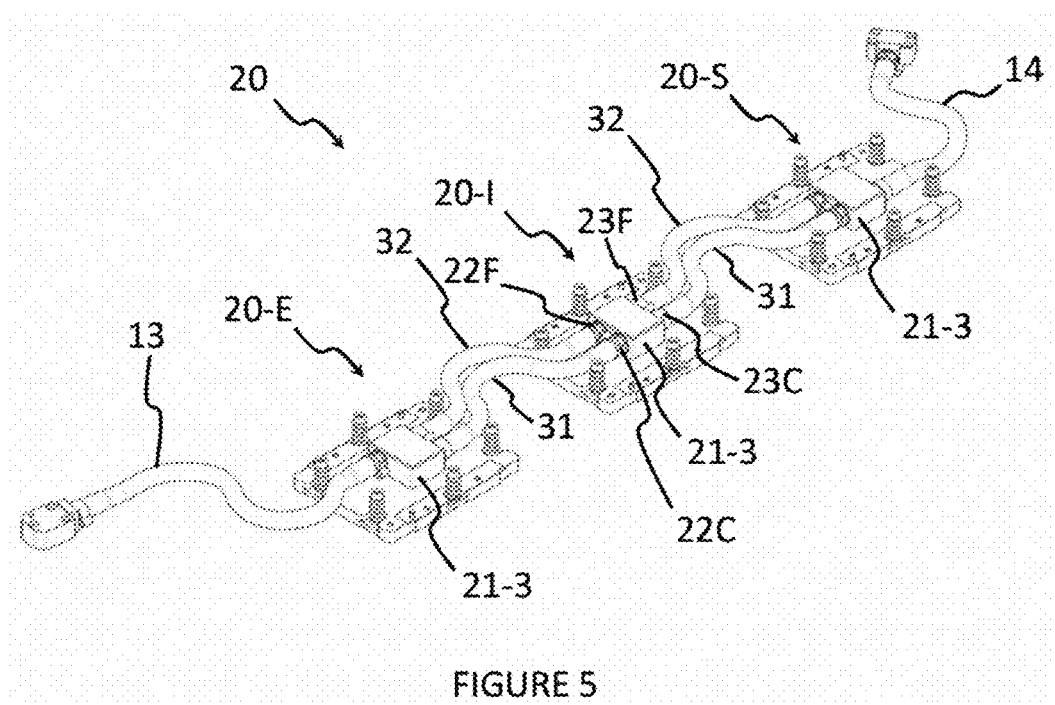
FIG. 5 schematically illustrates, partially, an assembly of heat sinks comprising a interlayer heat sink, according to one or more embodiments of the invention.

In at least one embodiment, illustrated in FIG. 5, each assembly of heat sinks further comprises an interlayer heat sink 20-I, fluidly connected on the one hand to the hot outlet connector 23C and the cold outlet connector 23F of the inlet heat sink 20-E and on the other hand to the hot inlet connector 22C and the cold inlet connector 22F of the outlet heat sink 20-S. This configuration allows cooling a matrix of 3×3 (i.e. 9) processors (or more) simultaneously.

Figure 5A:
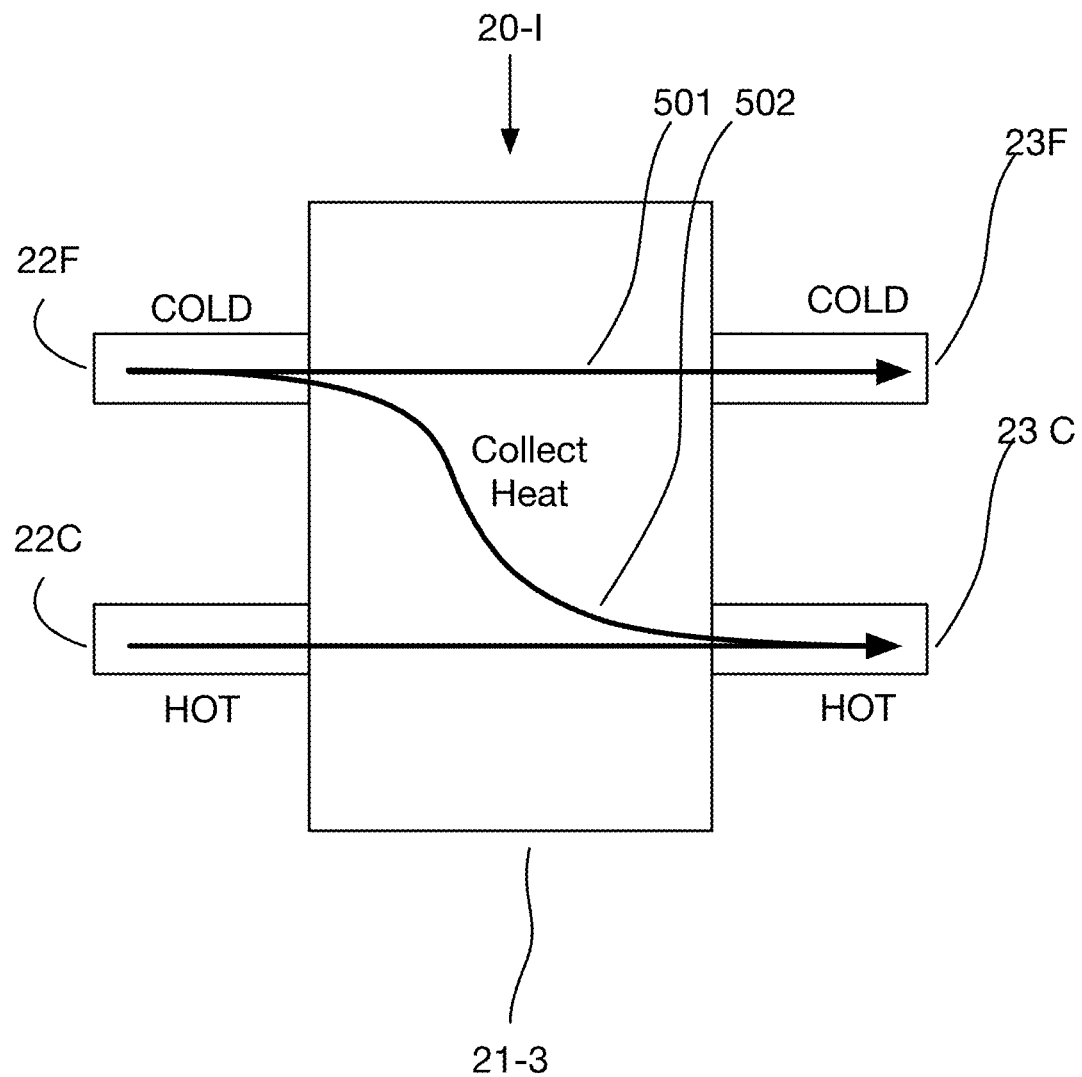
FIG. 5A illustrates a first flow and a second flow from FIG. 5, according to one or more embodiments of the invention.

The interlayer heat sink 20-I comprises a so-called "cold" inlet connector 22F to be fluidly connected to the cold outlet connector 23F of the inlet heat sink 20-E and fluidly connected to the upper part 21-3 of the cooling block 21 so that the cooling block 21 is supplied with the cold heat transfer fluid. The interlayer heat sink 20-I comprises a so-called "hot" inlet connector 22C to be fluidly connected to the hot outlet connector 23C of the inlet heat sink 20-E and fluidly connected to the upper part 21-3 of the cooling block 21. The interlayer heat sink 20-I comprises a so-called "hot" outlet connector 23C to be fluidly connected to the hot inlet connector 22C of the outlet heat sink 20-S. The interlayer heat sink 20-I comprises a so-called "cold" outlet connector 23F to be fluidly connected to the cold inlet connector 22F of the outlet heat sink 20-S. The upper part 21-3 of the cooling block 21 is configured to divide the flow of heat transfer fluid entering through the cold inlet connector 22F into a first flow, which is oriented towards the lower part 21-1 of the cooling block 21 so as to collect heat generated by the electronic card 5 by being conveyed to the hot outlet connector 23C, and a second flow, oriented directly towards the cold outlet connector 23F, and convey the flow of heated-up heat transfer fluid received on the hot inlet connector 22C directly to the hot outlet connector 23C. FIG. 5A, by way of one or more embodiments, illustrates the interlayer heat sink 20-I, and the upper part 21-3 of the cooling block 21, wherein the upper part 21-3 of the cooling block 21 is configured to divide the flow of heat transfer fluid entering through the cold inlet connector 22F into the first flow 501 and the second flow 502.

In at least one embodiment, the system 1 could comprise more or less than three assemblies of heat sinks and each assembly of heat sinks could comprise, in addition to an inlet heat sink 20-E and an outlet heat sink 20-S, one or more interlayer heat sinks 20-I, connected in series.

Exemplary Implementation

The heat transfer fluid circulating in the cooling circuit of the cold plate, before entering the inlet heat sinks, is referred to as "cold" fluid. The heat transfer fluid circulating in the cold plate discharge circuit after passing through the heat sink assemblies is referred to as "hot" fluid.

Figure 6:
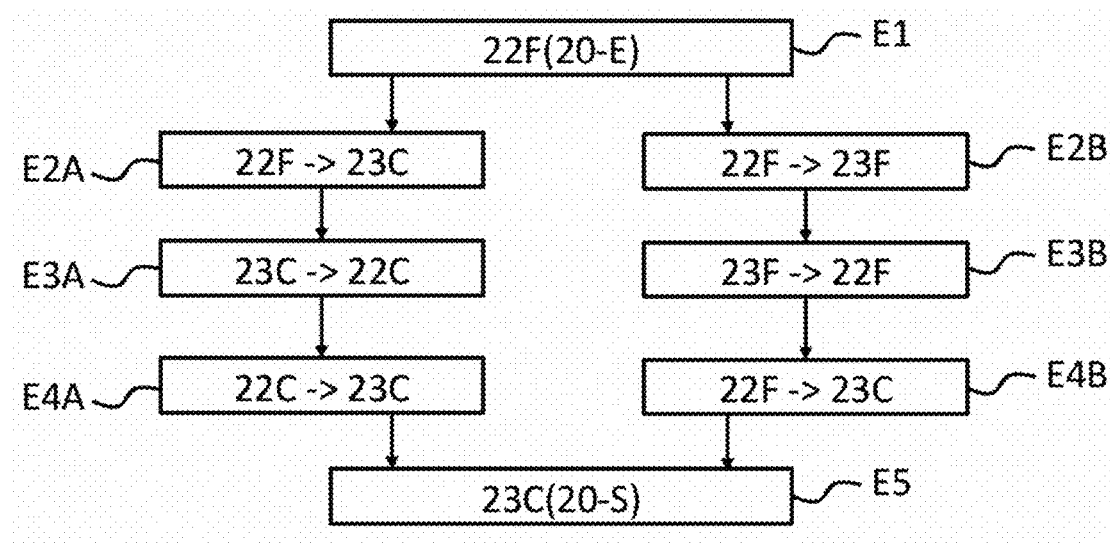
FIG. 6 schematically illustrates a method according to one or more embodiments of the invention.

Thus, with reference to FIG. 6, by way of one or more embodiments, in a step E1, the cold heat transfer fluid is conveyed by the cooling circuit to the cold inlet connector 22F of each inlet heat sink 20-E in order to supply it.

Each inlet heat sink 20-E divides the flow of cold heat transfer fluid entering through the cold inlet connector 22F into a first flow and a second flow, substantially equal in flow rate, the flow rate being about half the flow rate of the incoming flow.

The first flow is directed from the cold inlet connector 22F to the lower part 21-3 of the cooling block 21 in a step E2A so as to collect heat generated by the electronic card 5 and then be conveyed to the hot outlet connector 23C.

The second flow is directed in a step E2B directly to the cold outlet connector 23F without passing through the lower part 21-3 of the cooling block 21 and therefore without undergoing heating-up by the electronic card 5.

In a step E3A, the first heated-up flow is conveyed from the hot outlet connector 23C of the inlet heat sink 20-E to the hot inlet connector 22C of the outlet heat sink 20-S via the first connecting tube 31.

In a step E3B, the second flow, comprised of cold heat transfer fluid, is conveyed at the inlet of the cold inlet connector 22F of the outlet heat sink 20-S.

In a step E4A, the flow of heated-up heat transfer fluid is transferred directly from the hot inlet connector 22C of the outlet heat sink 20-S to the hot outlet connector 23C of the outlet heat sink 20-S.

In a step E4B, the second flow is conveyed to the lower part 21-3 of the cooling block 21 of the outlet heat sink 20-S so as to collect heat generated by the electronic card 5, then to the hot outlet connector 23C of the outlet heat sink 20-S where it mixes, in a step E5, with the heated-up flow of heat transfer fluid provided by step E4A, so as to regain the initial flow rate of the inlet flow of step E1.

The one or more embodiments of invention makes it possible to have the assemblies 20 of heat sinks 20-E, 20-S in parallel by reducing the number of inlet tubes 13 and outlet tubes 14 while allowing easy maintenance.

What is claimed is:

1. An interlayer heat sink for a liquid cooling system for an electronic card, said electronic card comprising at least one electronic component, said liquid cooling system comprising a cold plate for receiving said interlayer heat sink, said cold plate being dimensioned to cover at least partly the electronic card and comprising a cooling circuit comprising channels in which a cold heat transfer fluid for supplying at least said interlayer heat sink circulates, and a discharge circuit comprising channels in which a hot heat transfer fluid that has heated up through the interlayer heat sink circulates, the interlayer heat sink comprising:
   a cooling block comprising a lower part constituting a main heat exchange zone and an upper part to be connected to the cold plate,
   a cold inlet connector configured to be fluidly connected to a cold outlet connector of an upstream heat sink and fluidly connected to the upper part of said cooling block such that said cooling block is supplied with the cold heat transfer fluid,
   a hot inlet connector configured to be fluidly connected to a hot outlet connector of said upstream heat sink and fluidly connected to the upper part of said cooling block,
   a hot outlet connector configured to be fluidly connected to a hot inlet connector of a downstream heat sink, and
   a cold outlet connector configured to be fluidly connected to a cold inlet connector of said downstream heat sink,
   wherein the upper part of the cooling block is configured to
      divide a flow of heat transfer fluid entering through the cold inlet connector into
         a first flow, which is oriented towards the lower part of the cooling block so as to collect heat generated by the electronic card and then conveyed to the hot outlet connector, and
         a second flow, oriented directly towards the cold outlet connector,
      convey heated-up heat transfer fluid flow received on the hot inlet connector directly to the hot outlet connector.

2. The interlayer heat sink according to claim 1, wherein the at least one electronic component is a processor, a voltage regulator, or a memory module.

3. The interlayer heat sink according to claim 1, wherein the cooling block is made of a heat-conducting material.

4. A system for liquid cooling of an electronic card, said electronic card comprising at least one electronic component, said system comprising:
   a cold plate and at least one assembly of heat sinks, the cold plate being configured to receive said at least one assembly of heat sinks, being dimensioned to at least partly cover the electronic card, and wherein said cold plate comprises
      a cooling circuit comprising channels inside which a cold heat transfer fluid for supplying at least one of the heat sinks of said at least one assembly of heat sinks circulates, and
      a discharge circuit comprising channels inside which a hot heat transfer fluid has heated up through at least one of the heat sinks of said at least one assembly of heat sinks circulates,
   wherein each heat sink of said at least one assembly of heat sinks comprises a main heat exchange zone capable of bearing against one electronic component of the at least one electronic component, wherein each assembly of heat sinks of the at least one assembly of heat sinks comprises at least one interlayer heat sink an inlet heat sink, and an outlet heat sink, wherein each interlayer heat sink of said at least one interlayer heat sink comprises
- a cooling block comprising a lower part constituting a main heat exchange zone and an upper part to be connected to the cold plate,
- a cold inlet connector configured to be fluidly connected to a cold outlet connector of an upstream heat sink and fluidly connected to the upper part of said cooling block such that said cooling block is supplied with the cold heat transfer fluid,
- a hot inlet connector configured to be fluidly connected to a hot outlet connector of said upstream heat sink and fluidly connected to the upper part of said cooling block,
- a hot outlet connector configured to be fluidly connected to a hot inlet connector of a downstream heat sink, and
- a cold outlet connector configured to be fluidly connected to a cold inlet connector of said downstream heat sink,
- wherein the upper part of the cooling block is configured to
  - divide a flow of heat transfer fluid entering through the cold inlet connector into
    - a first flow, which is oriented towards the lower part of the cooling block so as to collect heat generated by the electronic card and then conveyed to the hot outlet connector, and
    - a second flow, oriented directly towards the cold outlet connector,
  - convey heated-up heat transfer fluid flow received on the hot inlet connector directly to the hot outlet connector,
- wherein said inlet heat sink comprises
  - a cooling block comprising a lower part constituting a main heat exchange zone and an upper part to be connected to the cold plate,
  - a cold inlet connector fluidly connected to the upper part of said cooling block and receiving an inlet tube of the cooling circuit such that said cooling block is supplied with heat transfer fluid from the cold plate,
  - a hot outlet connector,
  - a cold outlet connector,
    - wherein the upper part of the cooling block is configured to divide a flow of heat transfer fluid entering through the cold inlet connector into a first flow, which is oriented towards the lower part of the cooling block so as to collect heat generated by the electronic card and then conveyed to the hot outlet connector, and a second flow, oriented directly towards the cold outlet connector,
- wherein said inlet heat sink comprises
  - a cooling block comprising a lower part constituting a main heat exchange zone and an upper part to be connected to the cold plate,
  - a cold inlet connector fluidly connected to the upper part of said cooling block and receiving a connecting tube of the cooling circuit such that said cooling block is supplied with heat transfer fluid from the cold plate through the inlet heat sink,
  - a hot inlet connector fluidly connected to the upper part of said cooling block and which is for receiving a connecting tube of a heated-up flow of the heat transfer fluid,
  - a hot outlet connector, the upper part of the cooling block being configured, on one hand, to convey the heated-up flow of heat transfer fluid entering through the cold inlet connector to the lower part of the cooling block so as to collect heat generated by the electronic card by being conveyed to the hot outlet connector, and, on another hand, to convey the heated-up flow of heat transfer fluid received on the hot inlet connector directly to the hot outlet connector,
  - wherein the hot inlet connector of the each interlayer heat sink is fluidly connected to the cold outlet connector of the inlet heat sink,
  - wherein the hot inlet connector of the each interlayer heat sink is fluidly connected to the hot outlet connector of the inlet heat sink,
  - wherein the hot outlet connector of the each interlayer heat sink is fluidly connected to the hot inlet connector of the outlet heat sink,
  - wherein the cold outlet connector of the each interlayer heat sink is fluidly connected to the cold inlet connector of the outlet heat sink.

5. The system according to claim 4, wherein
the hot outlet connector of the inlet heat sink is connected to the hot inlet connector of the each interlayer heat sink by one or more of
a flexible connecting tube, and
a rectilinear connecting tube,
the cold outlet connector of the inlet heat sink is connected to the cold inlet connector of the each interlayer heat sink through one or more of
a flexible connecting tube, and
a rectilinear connecting tube.

6. The system according to claim 4, wherein the at least one assembly of heat sinks comprises a plurality of assemblies of heat sinks arranged parallel to each other.

7. The system according to claim 4, wherein the inlet tube of said inlet heat sink is flexible.

8. The system according to claim 4, wherein an outlet tube of said outlet heat sink is flexible.

9. The system according to claim 4, wherein the each interlayer heat sink is connected to one or more of the inlet heat sink and the outlet heat sink via one or more of
flexible connecting tubes, and
rectilinear connecting tubes.

10. A method for managing a flow of heat transfer fluid in an interlayer heat sink for a liquid cooling system for an electronic card, said electronic card comprising at least one electronic component, said liquid cooling system comprising a cold plate that receives said interlayer heat sink, said cold plate being dimensioned to cover at least partly the electronic card and comprising a cooling circuit comprising channels inside which a cold heat transfer fluid for supplying at least said interlayer heat sink circulates, and a discharge circuit comprising channels inside which a hot heat transfer fluid that has heated up through the interlayer heat sink circulates, wherein said interlayer heat sink comprises
a cooling block comprising a lower part constituting a main heat exchange zone and an upper part to be connected to the cold plate,
a cold inlet connector configured to be fluidly connected to a cold outlet connector of an upstream heat sink and fluidly connected to the upper part of said cooling block such that said cooling block is supplied with the cold heat transfer fluid, a hot inlet connector configured to be fluidly connected to a hot outlet connector of said upstream heat sink and fluidly connected to the upper part of said cooling block, a hot outlet connector configured to be fluidly connected to a hot inlet connector of a downstream heat sink, and a cold outlet connector configured to be fluidly connected to a cold inlet connector of said downstream heat sink;

said method comprising:

supplying the cold inlet connector with heat transfer fluid from the cold plate, dividing a flow of heat transfer fluid entering through the cold inlet connector into a first flow, which is oriented towards the lower part of the cooling block so as to collect heat generated by the electronic card and then conveyed to the hot outlet connector, and a second flow, oriented directly to the cold outlet connector, supplying the hot inlet connector with a flow of heated-up heat transfer fluid, conveying the flow of heated-up heat transfer fluid received on the hot inlet connector directly to the hot outlet connector where it fuses with heated-up flow in the lower part of the cooling block.

\* \* \* \* \*